United States Patent
Kim et al.

(10) Patent No.: US 10,727,419 B2
(45) Date of Patent: Jul. 28, 2020

(54) ORGANIC LIGHT EMITTING DISPLAY DEVICE

(71) Applicant: LG Display Co., Ltd., Seoul (KR)

(72) Inventors: JungKeun Kim, Seoul (KR); DoHan Kim, Gyeonggi-do (KR); Hyoseok Kim, Gyeonggi-do (KR); Hyeseung Kang, Seoul (KR); Min Yun, Gyeonggi-do (KR); SeungHee Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 243 days.

(21) Appl. No.: 14/793,902

(22) Filed: Jul. 8, 2015

(65) Prior Publication Data

US 2016/0133855 A1 May 12, 2016

(30) Foreign Application Priority Data

Nov. 10, 2014 (KR) ........................ 10-2014-0155201

(51) Int. Cl.
*H01L 51/00* (2006.01)
*H01L 51/50* (2006.01)
*H01L 51/52* (2006.01)

(52) U.S. Cl.
CPC ...... *H01L 51/0072* (2013.01); *H01L 51/0067* (2013.01); *H01L 51/0073* (2013.01); *H01L 51/0074* (2013.01); *H01L 51/5012* (2013.01); *H01L 51/0004* (2013.01); *H01L 51/5016* (2013.01); *H01L 51/5056* (2013.01); *H01L 51/5072* (2013.01); *H01L 51/5096* (2013.01); *H01L 51/5206* (2013.01); *H01L 51/5221* (2013.01)

(58) Field of Classification Search
CPC combination set(s) only.
See application file for complete search history.

(56) References Cited

U.S. PATENT DOCUMENTS

2012/0292576 A1* 11/2012 Parham ............... C07D 209/86
252/500
2017/0077423 A1* 3/2017 Ahn ..................... H01L 51/0072

FOREIGN PATENT DOCUMENTS

| JP | 2013110262 A | 6/2013 |
| WO | 2010/004877 A1 | 1/2010 |
| WO | 2013/039914 A1 | 3/2013 |
| WO | WO 2016013875 A1 * | 1/2016 ............. C09K 11/06 |

OTHER PUBLICATIONS

Extended European Search Report dated Apr. 6, 2016 issued by the European Patent Office in corresponding European Patent Application No. 15178785.0.

* cited by examiner

*Primary Examiner* — Jennifer A Chriss
*Assistant Examiner* — Sean M DeGuire
(74) *Attorney, Agent, or Firm* — Morgan, Lewis & Bockius LLP

(57) ABSTRACT

An organic light emitting display device is disclosed. The organic light emitting display device comprises an anode; an organic layer on the anode; and a cathode on the organic layer, wherein the organic layer comprises a compound including a carbazole compound having hole characteristics and a material having electron characteristics.

3 Claims, 1 Drawing Sheet

ORGANIC LIGHT EMITTING DISPLAY DEVICE

This application claims the priority benefit of Korean Patent Application No. 10-2014-0155201 filed on Nov. 10, 2014, which is incorporated herein by reference for all purposes as if fully set forth herein.

BACKGROUND

Field of the Invention

The present invention relates to a hetero compound and an organic light emitting display device using the same, and more particularly, to an organic light emitting display device including a hetero compound having excellent thermal stability and bipolar property.

Discussion of the Related Art

Recently, there has been increasing importance of a flat panel display (FPD) along with the development of multimedia. To meet such increasing importance, there have been commercialized various displays, such as a liquid crystal display (LCD), plasma display panel (PDP), Field emission display (FED) and an organic light emitting display device.

Among those, an organic light emitting display device has the advantages in that it can be formed even on a flexible substrate, such as a plastic substrate, can be driven at a voltage lower by 10V or less as compared to a plasma display panel or inorganic light emitting display, has relatively low power consumption, and shows an excellent color sense. In addition, an organic light emitting display device can show the three colors of red, green and blue, and thus has been given many attentions of people as a next-generation display device that expresses rich colors.

An organic light emitting display device may be formed by stacking an anode, hole injection layer, hole transport layer, emitting layer, electron transport layer, electron injection layer and a cathode successively. In the case of a light emitting material, recombination of electrons with holes injected from both electrodes forms excitons. Singlet excitons are involved in fluorescence, while triplet excitons are involved in phosphorescence. Recently, light emitting materials tend to undergo a change from fluorescence to phosphorescence. This is because, in the case of fluorescence, about 25% of singlets are used for generating light and 75% of triplets are substantially lost in the form of heat among the excitons formed from an emitting layer, while a phosphorescence material has a light emitting mechanism by which all singlets and triplets are converted into light.

In the light emitting process of a phosphorescence device, holes injected from an anode meet electrons injected from a cathode at the host material of an emitting layer. It is a matter of course that holes meet electron pairs directly at a dopant but, in general, holes largely meet electrons at a host due to the high concentration of host. Herein, energy transfer occurs from singlet excitons formed at the host to singlets or triplets of a dopant, and from triplet excitons to triplets of a dopant.

Since the excitons transferred to singlets of a dopant are further transferred to triplets of a dopant through intersystem crossing, the first destination of all excitons is the triplet level of a dopant. The excitons are transferred to a ground state, while generating light. Herein, when the triplet energy of a hole transport layer or electron transport layer adjacent to the front or back side of an emitting layer is smaller than the triplet energy of a dopant, reverse energy transfer occurs from the dopant or host to those layers, resulting in a rapid drop in efficiency. Therefore, the triplet energy of hole/electron transport layers as well as the host material of an emitting layer plays a very important role in a phosphorescence device.

For the purpose of efficient energy transfer from a host to a dopant, it is essentially required that the triplet energy of a host is larger than that of a dopant. In the case of a green color, when the triplet energy of a dopant is 2.4 eV or more, a host should have a triplet energy of 2.5 eV or more for smooth energy transfer. However, a material having high triplet energy causes degradation of the quality of a device due to a decrease in efficiency, an increase in voltage, or the like. In addition, a material having low thermal stability and low electrical stability is problematic in that it causes degradation of the lifespan of a device. Therefore, it is required to develop a novel phosphorescence material having excellent thermal stability and electrical stability.

SUMMARY

Accordingly, the present invention is directed to an organic light emitting display device that substantially obviates one or more of the problems due to limitations and disadvantages of the related art.

An object of the present invention is to provide an organic light emitting display device having excellent thermal stability and bipolar property.

Additional features and advantages of the invention will be set forth in the descriptions which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an organic light emitting display device comprises an anode; an organic layer on the anode; and a cathode on the organic layer, wherein the organic layer comprises a compound represented by the following Chemical Formula 1:

[Chemical Formula 1]

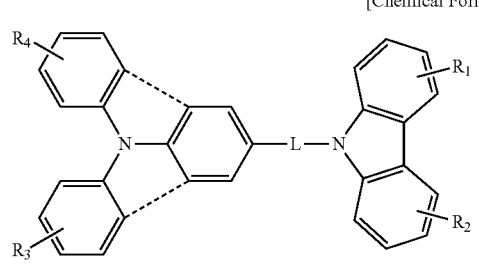

wherein each of $R_1$ and $R_2$ independently represents one of hydrogen and a substituted or non-substituted C3-C30 heteroarylene group, and at least one of $R_1$ and $R_2$ is a heteroarylene group; L represents a substituted or non-substituted C6-C30 arylene group or substituted or non-substituted heteroarylene group; each of $R_3$ and $R_4$ independently represents one of hydrogen, a substituted or non-substituted C6-C30 arylene group, C1-C10 alkyl group and a C3-C30 heteroarylene group; and at least one of the dotted lines is bonded.

In another aspect, an organic light emitting display device comprises an anode; an organic layer on the anode; and a cathode on the organic layer, wherein the organic layer comprises a compound including a carbazole compound having hole characteristics and a material having electron characteristics.

In another aspect, an organic layer comprises a host material including a carbazole compound having hole characteristics in combination with a material having electron characteristics, so that the lifespan and efficiency of an organic light emitting layer is optimized simultaneously.

It is understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
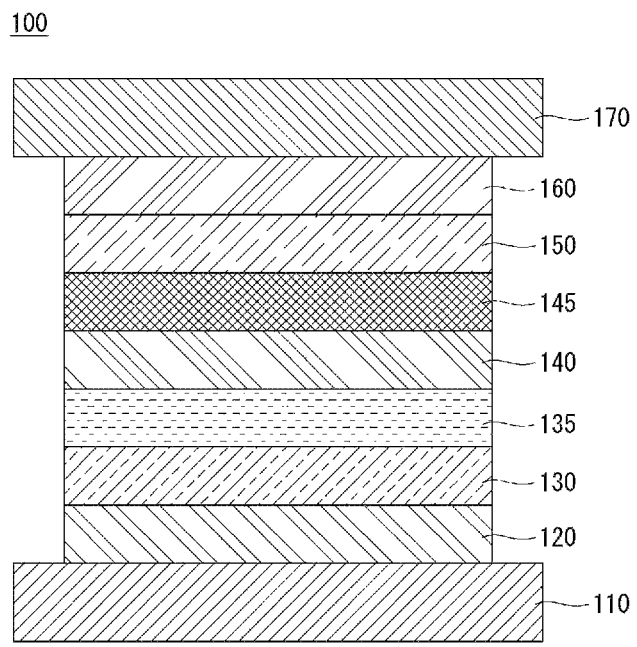
FIG. 1 is a view showing the organic light emitting display device according to an embodiment of the present invention.

The various aspects and features of the present invention and methods of accomplishing the same may be understood more readily by reference to the following detailed descriptions of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention is defined by the appended claims.

The shapes, sizes, percentages, angles, numbers, etc. shown in the figures to describe the exemplary embodiments of the present invention are merely examples and not limited to those shown in the figures. Like reference numerals denote like elements throughout the specification. In describing the present invention, detailed descriptions of related well-known technologies will be omitted to avoid unnecessary obscuring the present invention.

When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated. When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present invention.

The features of various exemplary embodiments of the present invention may be combined with one another either partly or wholly, and may technically interact or work together in various ways. The exemplary embodiments may be carried out independently or in combination with one another.

Hereinafter, various embodiments of the present invention will be described in detail with reference to the accompanying drawings.

FIG. 1 is a view showing the organic light emitting display device according to an embodiment of the present invention.

With reference to FIG. 1, the organic light emitting display device 100 according to an embodiment of the present invention includes organic layers 120, 130, 140, 150, 160 disposed between an anode 110 and a cathode 170. The anode 110 is an electrode for injecting holes and may include one of ITO (Indium Tin Oxide), IZO (Indium Zinc Oxide) and ZnO (Zinc Oxide) having a high work function. In addition, when the anode 110 is a reflective electrode, it may further have a reflective layer formed of one of aluminum (Al), silver (Ag) and nickel (Ni) at the bottom of the layer formed of one of ITO, IZO and ZnO.

A hole injection layer 120 is on the anode 110. The hole injection layer 120 may function to facilitate the injection of holes from the anode 110 to a light emitting layer 140, and may include at least one of CuPc (cupper phthalocyanine), PEDOT (poly(3,4)-ethylenedioxythiophene), PANI (polyaniline) and NPD (N,N'-bis(naphthalen-1-yl)-N,N'-bis(phenyl)-2,2'-dimethylbenzidine) but is not limited thereto. The hole injection layer 120 may have a thickness of 1~150 nm. Herein, when the hole injection layer 120 has a thickness of 1 nm or more, it is possible to improve hole injection property. When the hole injection layer 120 has a thickness of 150 nm or less, it is possible to prevent an increase in thickness of the hole injection layer 120 and to prevent an increase in driving voltage. The hole injection layer 120 may not be included in the construction of an organic light emitting display device depending on the structure or characteristics of a device.

A hole transport layer 130 is disposed on the hole injection layer 120. The hole transport layer 130 functions to facilitate the transport of holes, and may include at least one selected from the group consisting of NPD (N,N'-bis(naphthalen-1-yl)-N,N'-bis(phenyl)-2,2'-dimethylbenzidine), TPD (N,N'-bis(3-methylphenyl)-N,N'-bis-(phenyl)-benzidine), spiro-TAD (2,2',7,7'-tetrakis(N,N-diphenylamino)-9,9'-spirofluorene) and MTDATA (4,4',4"-Tris(N-3-methylphenyl-N-phenylamino)-triphenylamine) but is not limited thereto. The hole transport layer 130 may have a thickness of 1~150 nm. When the hole transport layer 130 has a thickness of 1 nm or more, it is possible to improve hole transport property. When the hole transport layer 130 has a thickness of 150 nm or less, it is possible to prevent an increase in thickness of the hole transport layer 130 and to prevent an increase in driving voltage.

An electron blocking layer 135 is disposed on the hole transport layer 130. The electron blocking layer 135 functions to inhibit the electrons injected from the cathode 170 from passing toward the anode 110, and may include, for example, at least one selected from the group consisting of TPD (N,N'-bis(3-methylphenyl)-N,N'-bis(phenyl)-benzidine), NPD (N,N'-bis(naphthalen-1-yl)-N,N'-bis(phenyl)-2,2'-dimethylbenzidine), TCTA (4,4',4"-tris)carbozoyl-9-yl) triphenylamine) and CBP (4,4'-bis(carbazol-9-yl)biphenyl)

but is not limited thereto. The electron blocking layer 135 may not be included in the construction of an organic light emitting display device depending on the structure or characteristics of a device.

An emitting layer 140 is disposed on the electron blocking layer 135. The emitting layer 140 may emit red (R), green (G) and blue (B) light and may include a phosphorescent material. The emitting layer 140 includes a host and dopant, wherein the host serves to transfer energy toward the dopant. In this context, a hetero compound was introduced to a host by the present inventors in order to improve the properties of the emitting layer 140. The hetero compound has a carbazole group having hole transfer property and a heteroaryl group having electron transfer property. The hetero compound has bipolar property of hole characteristics and electron characteristics, and thus has electrical stability for holes and electrons. According to the present invention, it is possible to increase the light emitting region of an emitting layer by using a hetero compound having electrical stability for holes and electrons as a host for an emitting layer, thereby improving the lifespan of a device. In addition, it is possible to ensure thermal stability while providing high triplet energy by using a hetero compound having a carbazole compound and a material having electron characteristics including a heteroaryl group.

Further, it is possible to facilitate the injection of holes or electrons to an emitting layer by applying a hetero compound to at least one of a hole transport layer, an electron blocking layer, a hole blocking layer and an electron transport layer, thereby improving the lifespan of a device.

Therefore, according to an embodiment, the host of an emitting layer 140 includes a hetero compound represented by the following Chemical Formula 1. The host has a carbazole group and aryl group.

[Chemical Formula 1]

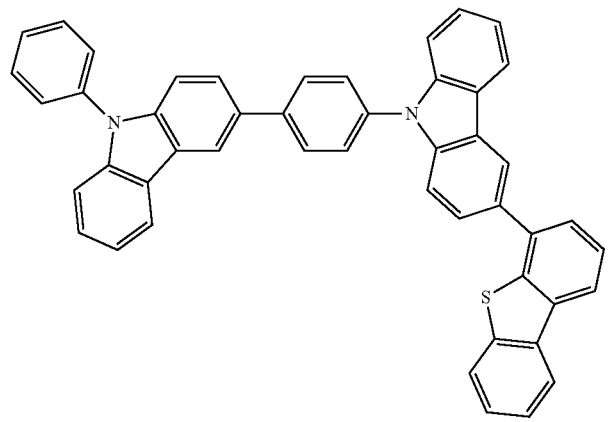

In Chemical Formula 1, each of $R_1$ and R2 independently represents one of hydrogen and a substituted or non-substituted C3-C30 heteroarylene group, and at least one of $R_1$ and $R_2$ is a heteroarylene group; L represents a substituted or non-substituted C6-C30 arylene group or substituted or non-substituted heteroarylene group; each of $R_3$ and $R_4$ independently represents one of hydrogen, a substituted or non-substituted C6-C30 arylene group, C1-C10 alkyl group and a C3-C30 heteroarylene group; and at least one of the dotted lines is bonded.

In the substituted or non-substituted C6-C30 arylene group or substituted or non-substituted heteroarylene group, the substituent is one of a C6-C30 aryl, C1-C6 alkyl and C3-C30 heteroaryl. L is one of the compounds represented by the following Chemical Formula 2.

[Chemical Formula 2]

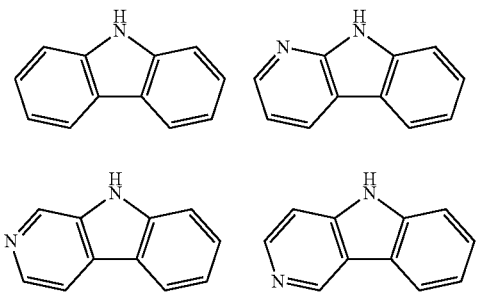

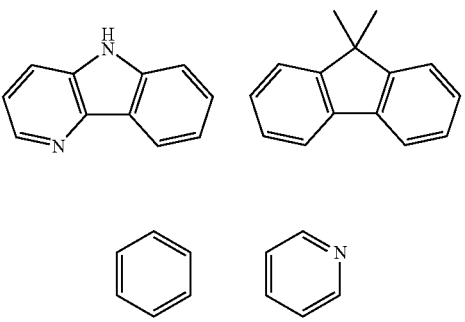

The hetero compound is one of the following compounds.

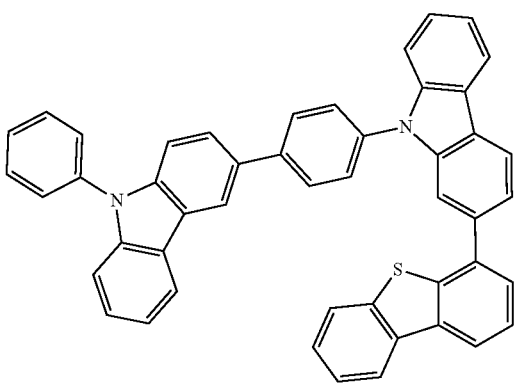

-continued
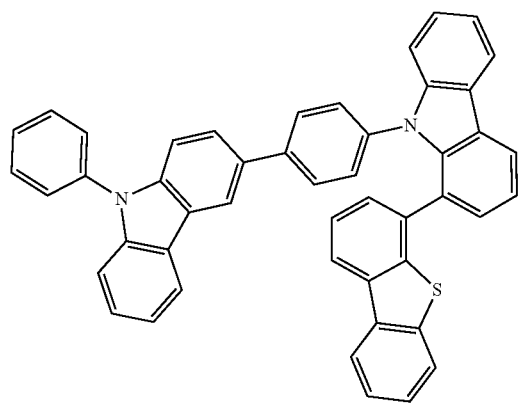
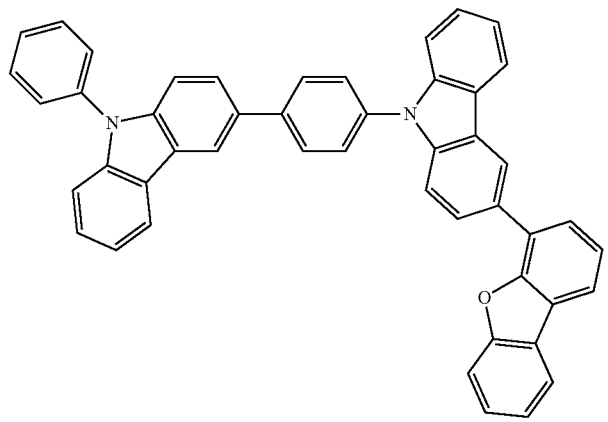
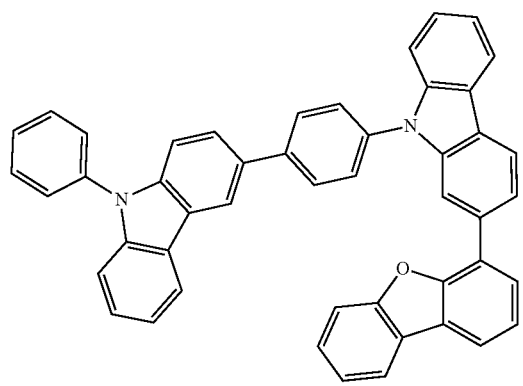
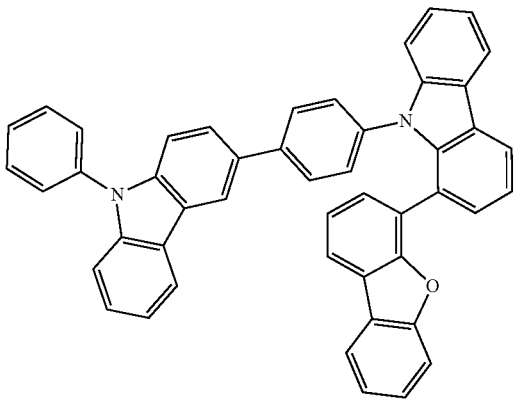
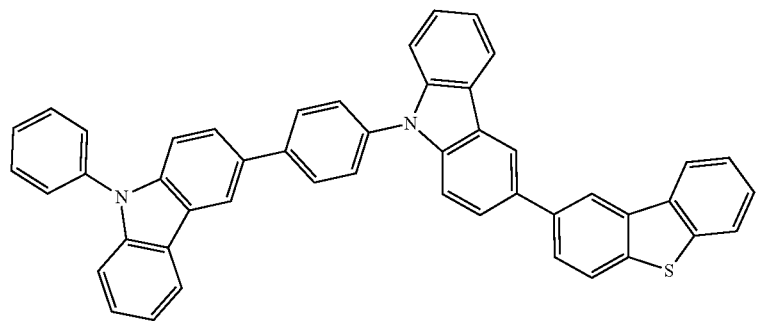
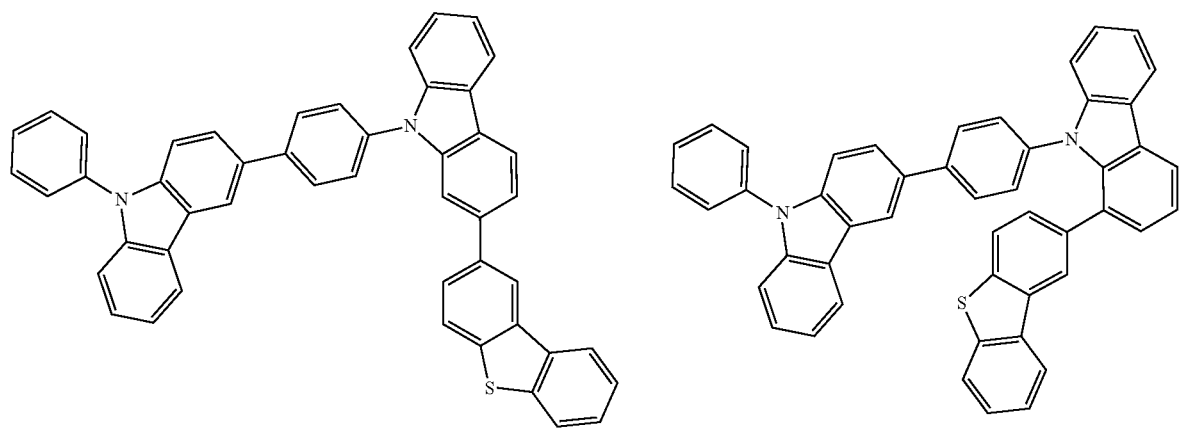

-continued
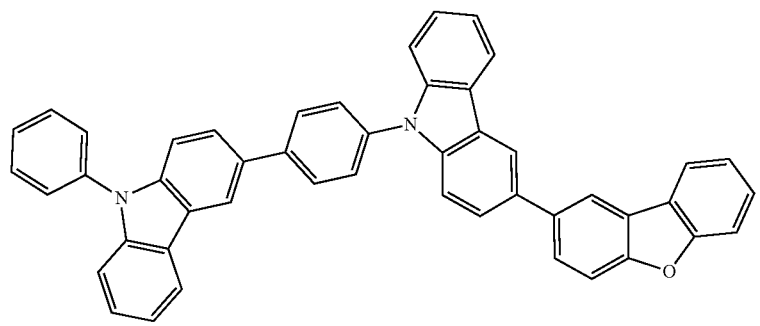
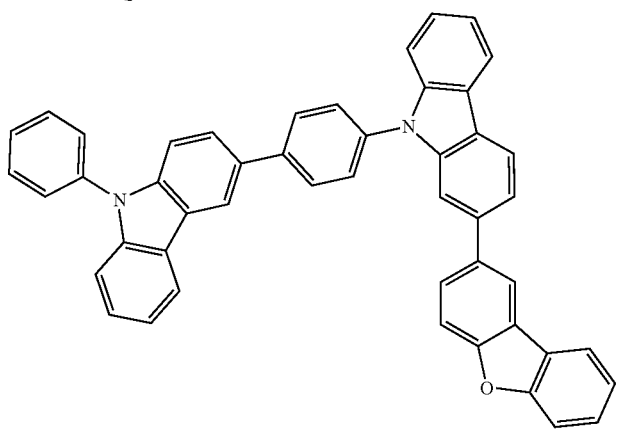
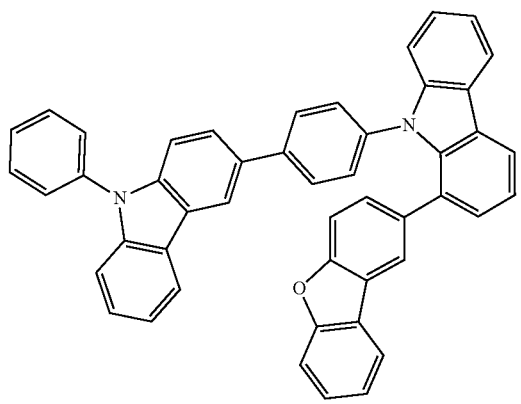
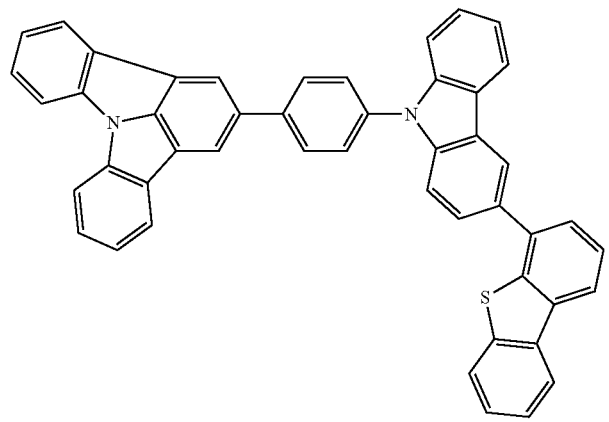
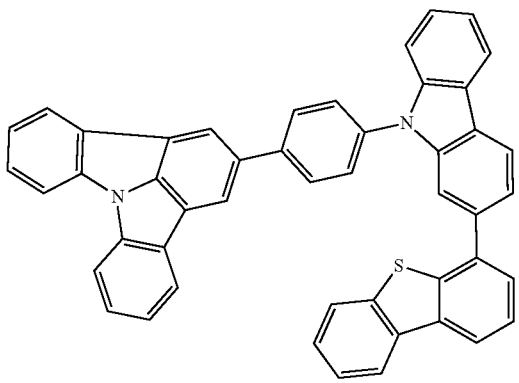
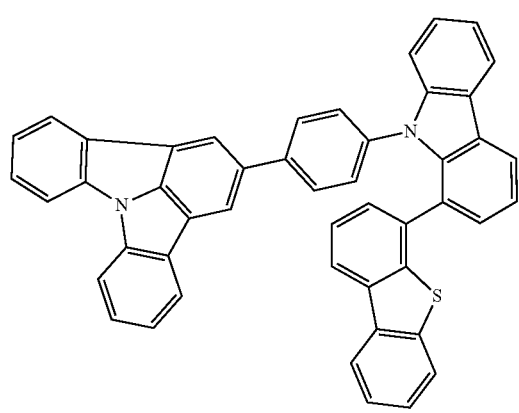
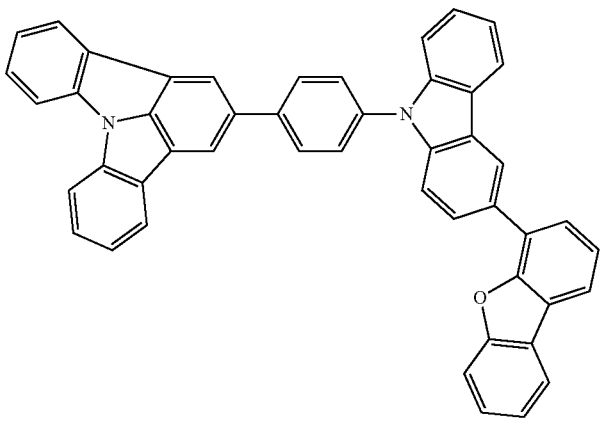

-continued
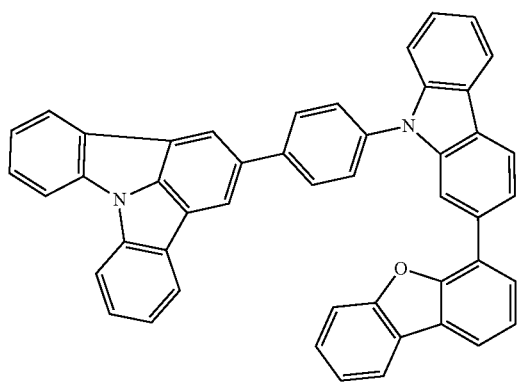 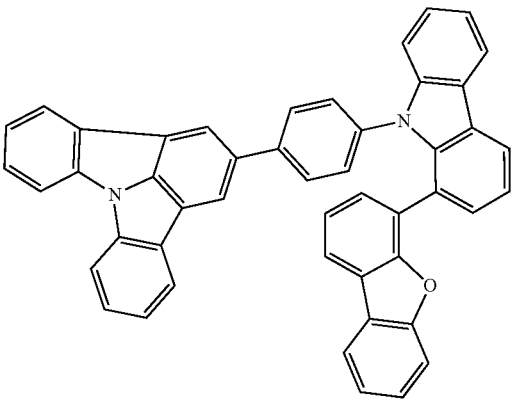
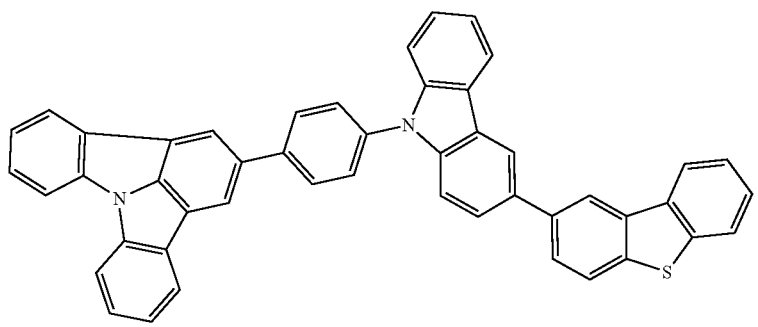
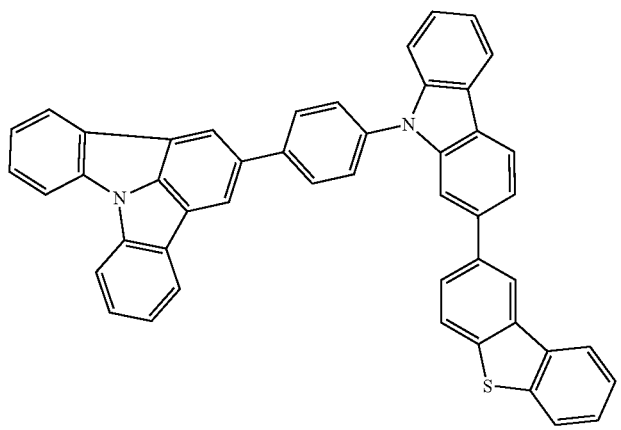
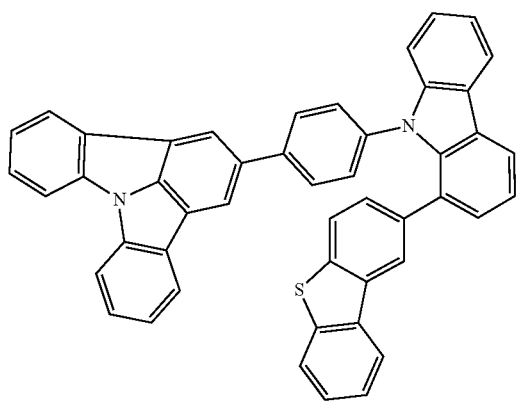

-continued
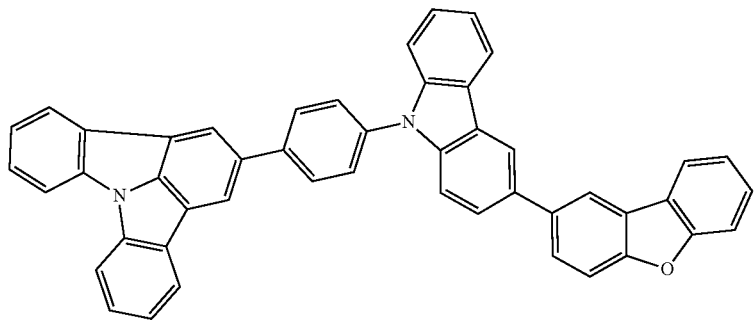
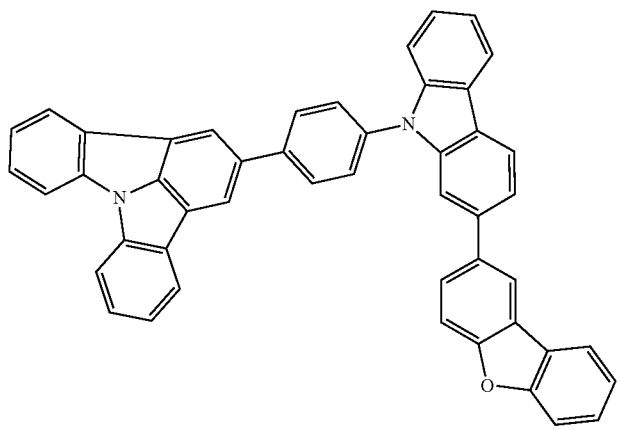
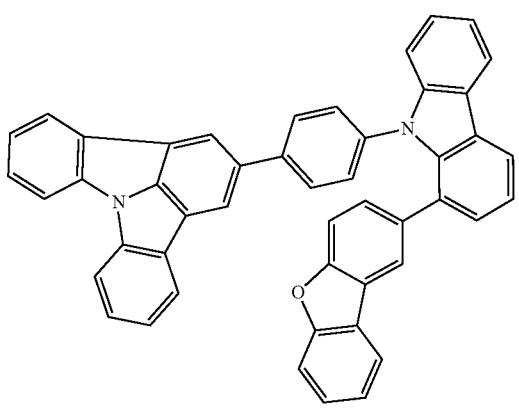
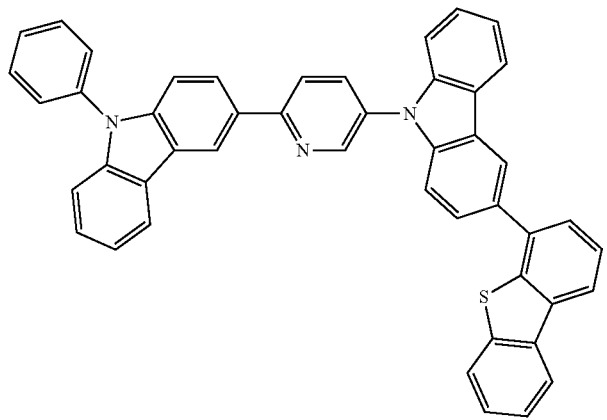
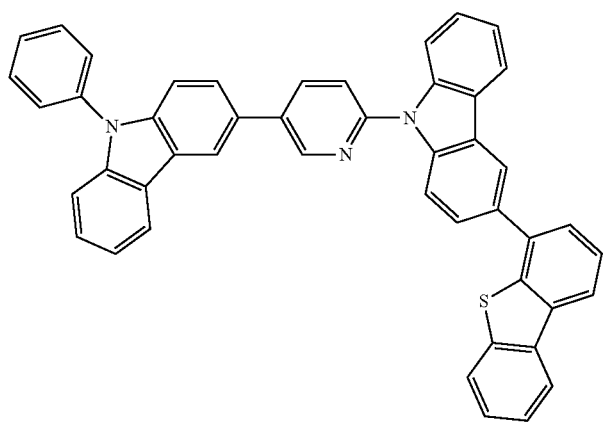

-continued
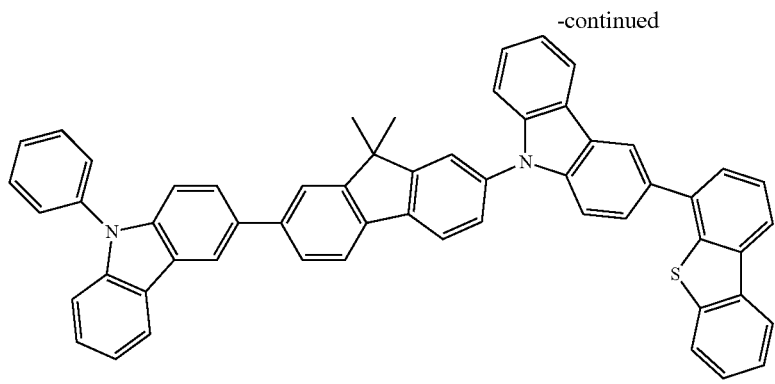
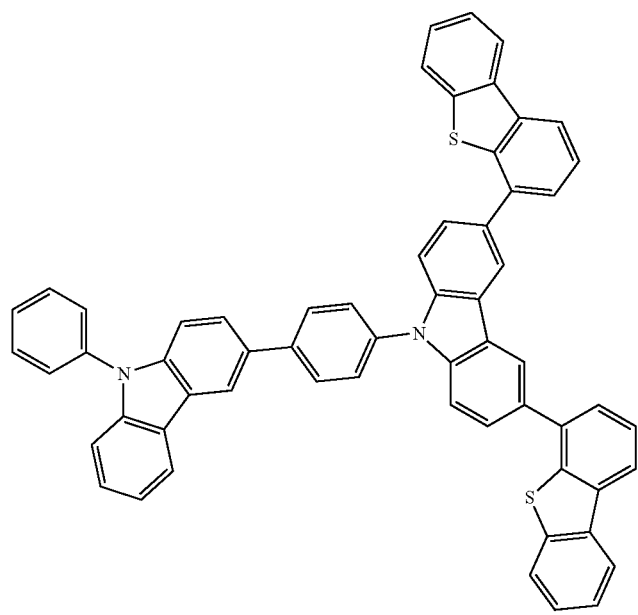 [SMILES: c1ccc(-n2c3ccccc3c3cc(-c4ccc(-n5c6ccc(-c7cccc8c7oc7ccccc78)cc6c6cc(-c7cccc8c7oc7ccccc78)ccc65)cc4)ccc32)cc1]
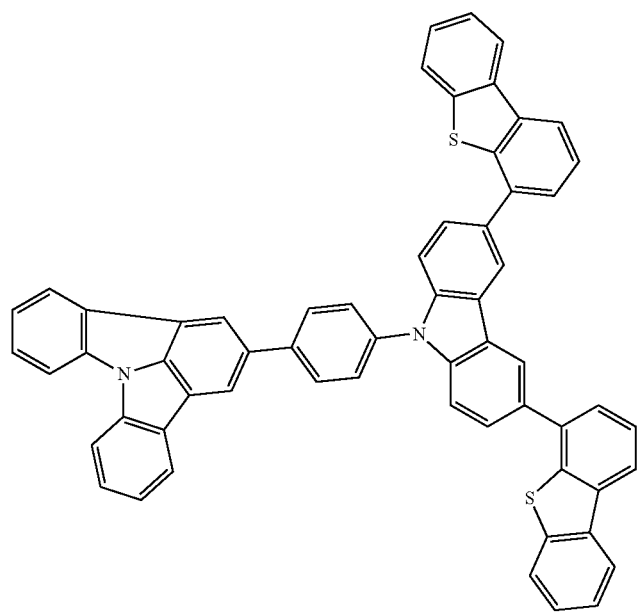

-continued
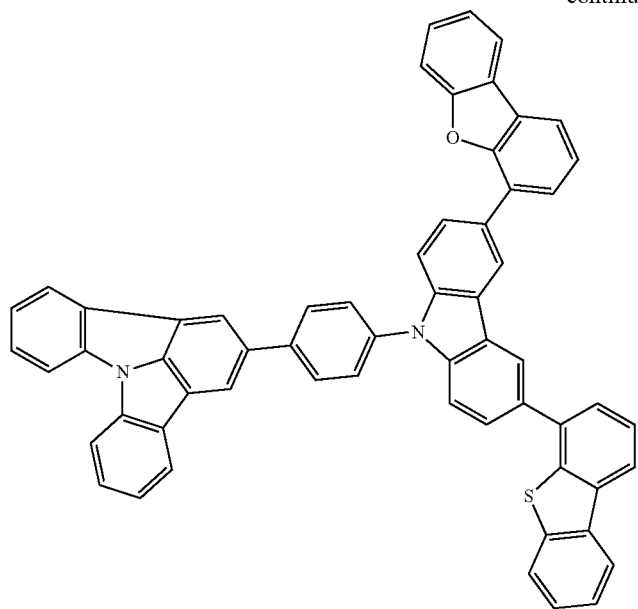
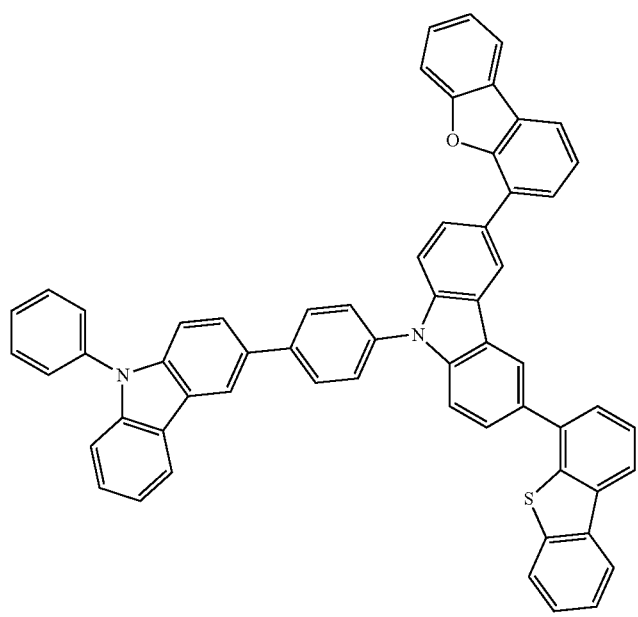

-continued

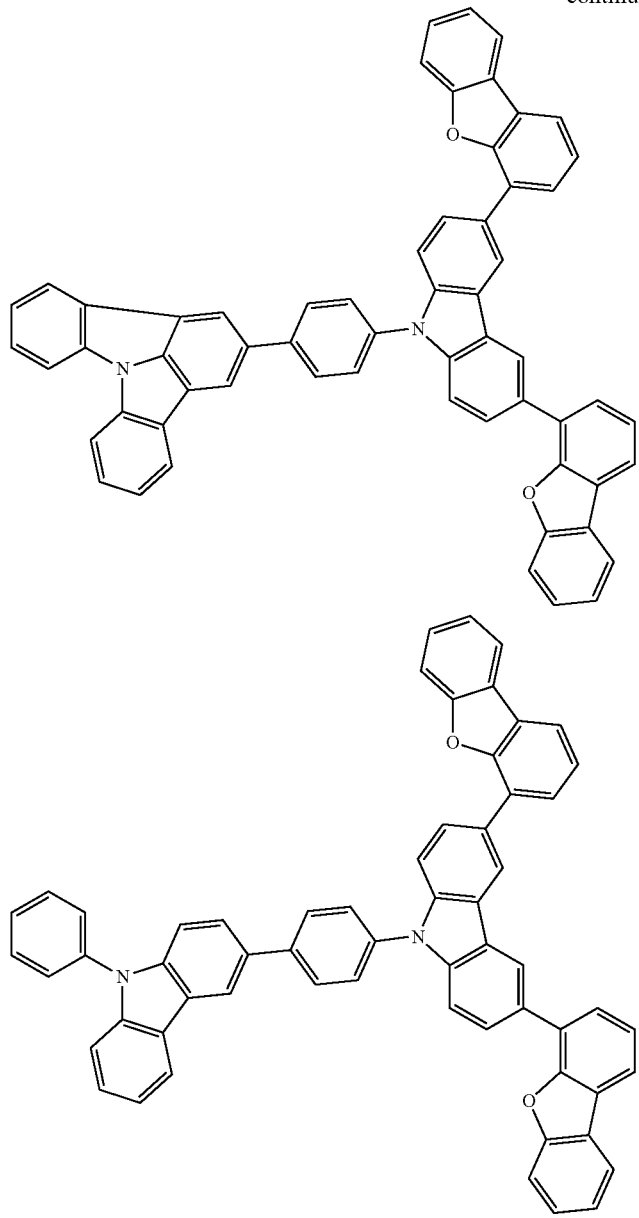

When the emitting layer 140 is a red one, it may be formed of a phosphorescent material that includes a host material, such as CBP (4,4'-bis(carbazol-9-yl)biphenyl), and a dopant having at least one of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium) and PtOEP (octaethylporphine platinum(II)), but is not limited thereto. When the emitting layer 140 is a green one, it may be formed of a phosphorescent material that includes a host material, such as CBP (4,4'-bis(carbazol-9-yl)biphenyl), and a dopant material having an iridium-based compound, but is not limited thereto. In a variant, the green emitting layer may be formed of a fluorescent material that includes Alq$_3$ (tris(8-hydroxyquinolino)aluminum), but is not limited thereto. When the emitting layer is blue one, it may be formed of a phosphorescent material that includes a host material, such as CBP (4,4'-bis(carbazol-9-yl)biphenyl), and a dopant material having an iridium-based compound, but is not limited thereto. In a variant, the blue emitting layer may be formed of a fluorescent material that includes one of spiro-DPVBi, spiro-CBP, distyrylbenzene (DSB), distyrylarylene (DSA), PFO polymers and PPV polymers, but is not limited thereto.

A hole blocking layer 145 is disposed on the emitting layer 140. The hole blocking layer 145 functions to inhibit the holes injected from the anode 110 from passing toward the cathode 170 and may include at least one of BAlq (Bis(2-methyl-8-quinolinolate)-4-(phenylphenolato)aluminum), BCP (2,9-dimethyl-4,7-diphenyl-1,10-phenanthroline) and TPBI (2,2'2''-(1,3,5-benzinetriyl)-tris(1-phenyl-1-H-benzimidazole), but is not limited thereto. The hole blocking layer 145 has a thickness of 10 Å~100 Å. When the hole blocking layer 145 has a thickness smaller than 10 Å, hole blocking property is not sufficient. When the hole blocking layer 145 has a thickness larger than 100 Å, the driving voltage of a device may be increased. The hole blocking layer 145 may not be included in the construction of an organic light emitting display device depending on the structure or characteristics of a device.

An electron transport layer 150 is disposed on the hole blocking layer 145. The electron transport layer 150 functions to facilitate electron transport and may include at least one of Alq$_3$ (tris(8-hydroxy-quinolinato)aluminum), PBD (2-(4-biphenyl)-5-(4-tert-butylphenyl)-1,3,4-oxadiazole), TAZ (3-(4-biphenyl)-4-phenyl-5-tert-butylphenyl-1,2,4-triazole) and BAlq (Bis(2-methyl-8-quinolinolate)-4-(phenylphenolato)aluminum), but is not limited thereto. The electron transport layer 150 may have a thickness of 1~50 nm. Herein, when the electron transport layer 150 has a thickness of 1 nm or more, it is possible to improve electron transport property. When the electron transport layer 150 has a thickness of 50 nm or less, it is possible to prevent an increase in thickness of the electron transport layer 150 and to prevent an increase in driving voltage.

An electron injection layer 160 is disposed on the electron transport layer 150. The electron injection layer 160 functions to facilitate electron injection and may include Alq$_3$ (tris(8-hydroxy-quinolinato)aluminum), PBD (2-(4-biphenyl)-5-(4-tert-butylphenyl)-1,3,4-oxadiazole), TAZ (3-(4-biphenyl)-4-phenyl-5-tert-butylphenyl-1,2,4-triazole) or BAlq (Bis(2-methyl-8-quinolinolate)-4-(phenylphenolato)aluminum), but is not limited thereto. On the other hand, the electron injection layer 160 may be formed of a metallic compound and the metallic compound may be at least one of LiQ, LiF, NaF, KF, RbF, CsF, FrF, BeF2, MgF$_2$, CaF$_2$, SrF$_2$, BaF$_2$ and RaF$_2$, but is not limited thereto. The electron injection layer 160 may have a thickness of 1~50 nm. When the electron injection layer 160 has a thickness of 1 nm or more, it is possible to improve electron injection property. When the electron injection layer 160 has a thickness of 50 nm or less, it is possible to prevent an increase in thickness of the electron injection layer 160 and to prevent an increase in driving voltage.

The cathode 170 is an electron injection electrode and may include magnesium (Mg), calcium (Ca), aluminum (Al), silver (Ag) or alloys thereof having a low work function. Herein, when the organic light emitting display device has a top emission or dual emission structure, the cathode 170 may be formed to have such a small thickness that it allows light transmission. When the organic light emitting display device has a bottom emission structure, the cathode may be formed to have such a large thickness that it allows light reflection.

As described above, according to the present invention, it is possible to improve the thermal stability of a host by using a hetero compound having a carbazole compound and a material having electron characteristics including a heteroaryl group as a host in an emitting layer. It is also possible to improve the lifespan of a device by virtue of the bipolar property of the hetero compound.

Hereinafter, preparation examples of the hetero compound according to the present invention and the characteristics of the compound will be described. The following examples are for illustrative purposes only and not intended to limit the scope of the present invention.

Synthesis of Compound A-1

1) Preparation of 3,6-di(benzothiophen-4-yl)-9H-carbazole

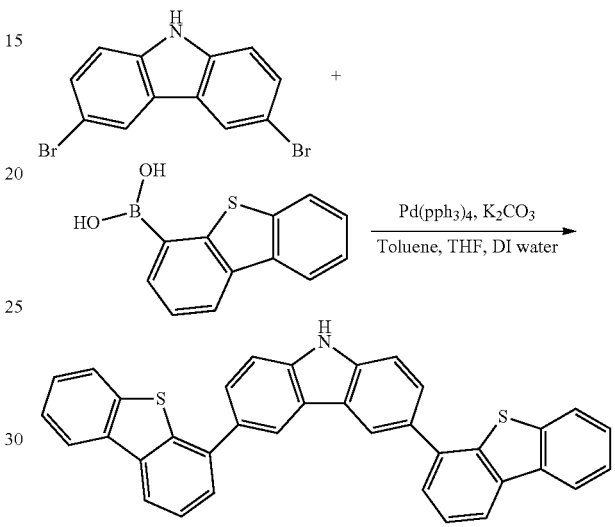

To a 250 mL two-neck flask, 3,6-dibromo-9H-carbazole (5 g, 15.4 mmol), dibenzothiophene-4-boronic acid (7.5 g, 33 mmol), tetrakis(triphenyl phosphin)palladium(0) (Pd (pph$_3$)$_4$) (348 mg, 0.30 mmol), and potassium carbonate (K$_2$CO$_3$) (6.2 g, 45 mmol) are introduced and dissolved into 40 mL of tetrahydrofuran (THF), 20 mL of toluene and 40 mL of DI water. Then, the reaction mixture is stirred under reflux for 24 hours. After the completion of reaction, the mixture was distilled under reduced pressure to remove the solvent and passed through a short column using boiling toluene. After removal of the solvent, the residue is separated by a silica column chromatography using methylene chloride and hexane (1:3), and the filtrate is subjected to distillation under reduced pressure to carry out recrystallization in methylene chloride/P.E (petroleum ether) as a solvent, thereby providing 7.1 g of white solid (yield 87%).

2) Preparation of (9-(4-(9-phenyl-9H-carbazol-3-yl) phenyl)-9H-3,6-di(benzothiophen-4-yl)carbazole)

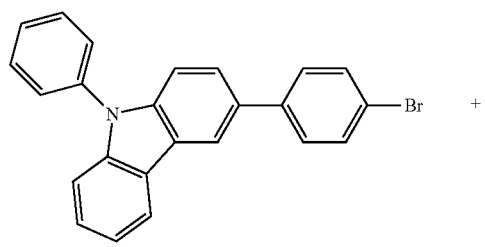

-continued

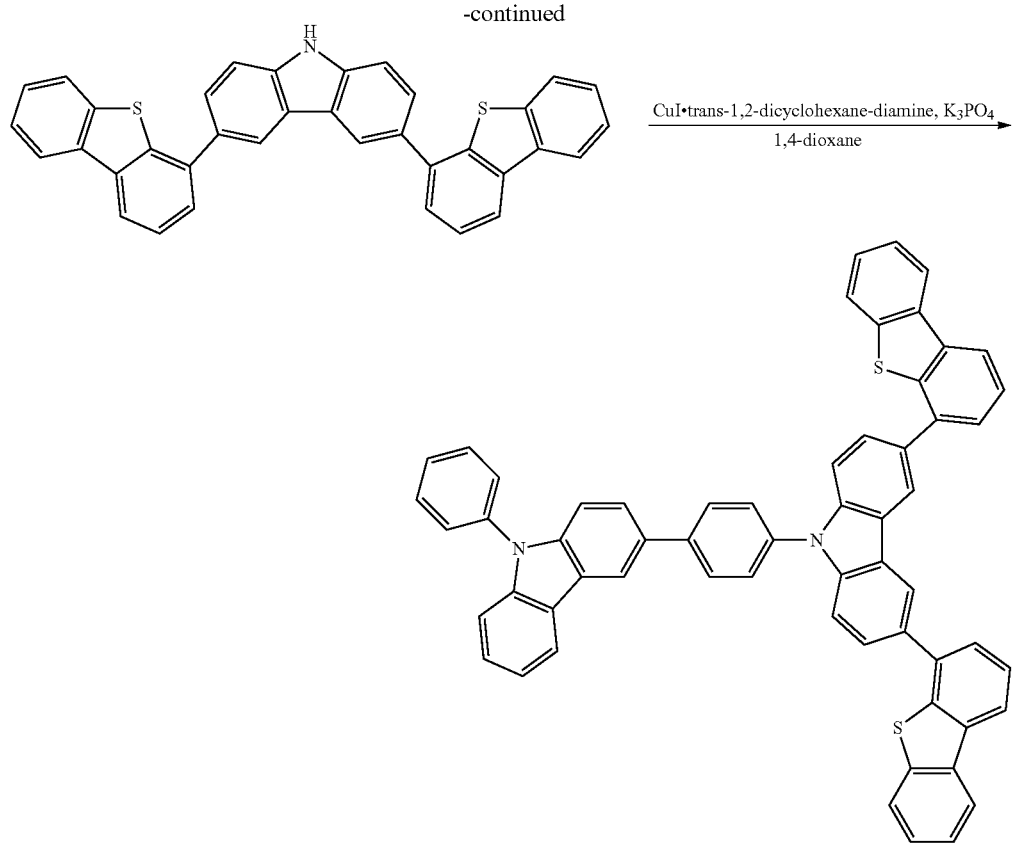

To a 250 mL two-neck flask, 3-(4-bromophenyl)-9-phenyl-9H-carbazole (2 g, 1.44 mmol), 3,6-di(benzothiophen-4-yl)-9H-carbazole (2.7 g, 1.44 mmol), copper iodide (CuI) (190 mg, 0.433 mmol), potassium phosphate ($K_3PO_4$) (2.1 g, 2.88 mmol), and trans-1,2-dicyclohexane-diamine (114 mg, 0.433 mmol) are introduced and dissolved into 50 mL of 1,4-dioxane. Then, the reaction mixture is stirred under reflux for 24 hours. After the completion of reaction, the mixture was distilled under reduced pressure to remove the solvent. After removal of the solvent, the residue is separated by a silica column chromatography using methylene chloride and hexane (1:3), thereby providing 3.5 g of Compound A-1 as white solid (yield 82%).

Figure 2:
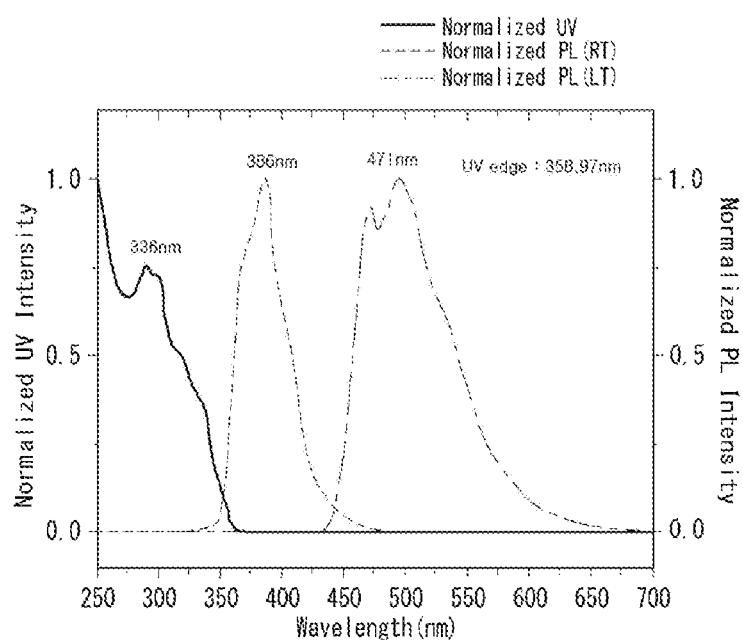
FIG. 2 is a graph showing the UV, PL and low-temperature PL spectra of Compound A-1.

FIG. 2 shows the UV absorption spectrum, PL spectrum and low-temperature (−77K) PL spectrum of the resultant Compound A-1. UV spectrometry is carried out by measuring the absorption spectrum of a material, as the material is irradiated with the light of UV region. Herein, UV spectrum of Compound A-1 is obtained by dissolving Compound A-1 into methylene chloride. PL spectrometry is carried out by measuring the spectrum of a material, as the excited electrons are converted into their ground state. Herein, PL spectrum of Compound A-1 is obtained by dissolving Compound A-1 into methylene chloride. In addition, low-temperature PL spectrum is carried out by measuring the PL spectrum of a material at low temperature. The first peak appearing additionally in a long-wavelength range as compared to room-temperature PL spectrum shows triplet energy. Herein, low-temperature PL spectrum of Compound A-1 is carried out by dissolving Compound A-1 into tetrahydrofuran and measuring spectrum at low temperature (−77K). In FIG. 2, the maximum light intensity of UV absorption spectrum is set to 1.0, and the values in PL and low-temperature PL spectrum are shown in proportion to the values in UV absorption spectrum. In addition, the UV edge is the longest wavelength of light capable of being absorbed actually and referees to as the bandgap (difference between HOMO level and LUMO level) of an actual material.

With reference to FIG. 2, Compound A-1 shows the highest intensity of UV absorption spectrum at a wavelength of 336 nm, that of PL spectrum at a wavelength of 386 nm, and that of PL spectrum at a wavelength of 471 nm. In addition, it can be seen from the UV absorption spectrum that the longest wavelength (UV edge) of light capable of being absorbed actually by Compound A-1 is 358.97 nm. A UV edge value of 350 nm or more suggests that the corresponding compound is suitable as a host. Therefore, it can be seen that the compound according to the present invention is suitable as a host, since it has a UV edge of 358.97 nm.

Hereinafter, some embodiments of the organic light emitting display device according to the present invention will be explained. However, it is to be understood that the scope of the present invention is not limited to the following materials of light emitting layer, or the like.

Comparative Example

A device was provided by stacking a hole injection layer, a hole transport layer, an electron blocking layer, an emitting layer, a hole blocking layer, an electron transport layer, an electron injection layer and an anode on a substrate. The emitting layer was formed as a green emitting layer by using CBP as a host to which Ir(ppy)$_3$ (Tris(2-phenylpyridine)

iridium(III)) is doped at a concentration of 15%. The device was provided and subjected to a test in the form of a mono-emission device.

Embodiment 1

A device was provided in the same manner as Comparative Example, except that the light emitting layer was formed as a green light emitting layer by using Compound A-1 as a host to which Ir(ppy)$_3$ (Tris(2-phenylpyridine) iridium(III)) is doped at a concentration of 15%.

Embodiment 2

A device was provided in the same manner as Comparative Example, except that the light emitting layer was formed as a green light emitting layer by using Compound A-2 as a host to which Ir(ppy)$_3$ (Tris(2-phenylpyridine) iridium(III)) is doped at a concentration of 15%.

A-2

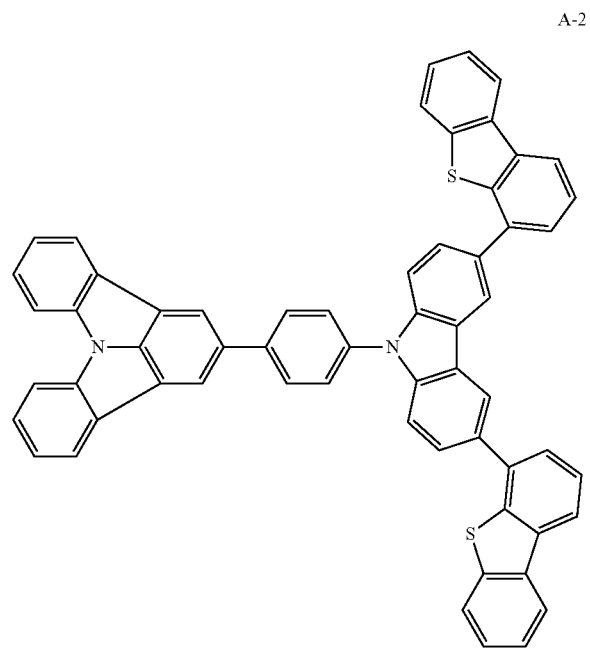 [SMILES: c1ccc2c(c1)sc1c(-c3ccc4c(c3)c3cc(-c5cccc6c5sc5ccccc56)ccc3n4-c3ccc(-c4cc5c6ccccc6n6c7ccccc7c(c4)c56)cc3)cccc12]

The spirit and scope of the present invention are not limited to the materials of emitting layer described in the above Comparative Example and Embodiments 1 and 2.

The HOMO level, LUMO level, energy bandgap, triplet energy and glass transition temperature of each of the host compounds used in Comparative example and Embodiments 1 and 2 are determined and shown in the following Table 1.

TABLE 1

|  | HOMO level (eV) | LUMO level (eV) | Energy bandgap (eV) | Triplet energy (eV) | Glass transition temperature (° C.) |
| --- | --- | --- | --- | --- | --- |
| Comparative Example | −5.9 | −2.40 | 3.50 | 2.60 | 62 |
| Embodiment 1 | −5.5 | −2.05 | 3.45 | 2.63 | 139 |
| Embodiment 2 | −5.6 | −2.22 | 3.38 | 2.60 | 145 |

As can be seen from Table 1, each of the hosts of embodiments 1 and 2 shows a higher HOMO level and LUMO level and equivalent energy bandgap and triplet energy as compared to the host of Comparative Example. Particularly, the host of Comparative Example shows a glass transition temperature of 62° C., while the hosts of embodiments 1 and 2 according to the present invention show a glass transition temperature of 139° C. and 145° C., respectively, suggesting that the hosts according to the present invention have higher thermal stability.

In addition, the driving voltage, current density, quantum efficiency, luminous efficiency and lifespan of each of the devices obtained according to Comparative example and Embodiments 1 and 2 were determined and shown in the following Table 2.

TABLE 2

|  | Driving voltage (V) | Current density (mA/cm$^2$) | Quantum efficiency (%) | Luminous efficiency | | Lifespan (hr) T95@ 10000 nit |
| --- | --- | --- | --- | --- | --- | --- |
|  |  |  |  | Cd/A | lm/W |  |
| Comparative Example | 4.5 | 10 | 17.5 | 59 | 41 | 15 |
| Embodiment 1 | 3.8 | 10 | 19.8 | 68 | 56 | 60 |
| Embodiment 2 | 4.1 | 10 | 19.5 | 66 | 51 | 69 |

With reference to Table 2, Embodiment 1 including the hetero compound A-1 as a host shows a driving voltage decreased by 16% and a quantum efficiency increased by 13%, as compared to Comparative Example including CBP as a host. In addition, Embodiment 1 shows a luminous efficiency increased by 15% and 36% and a lifespan increased by 300%, as compared to Comparative Example.

Embodiment 2 including the hetero compound A-2 as a host shows a driving voltage decreased by 9% and a quantum efficiency increased by 11%, as compared to Comparative Example. In addition, Embodiment 2 shows a luminous efficiency increased by 11% and 24% and a lifespan increased by 460%, as compared to Comparative Example.

It can be seen from the above results that the organic light emitting display device using the compound according to the present invention provides a decreased driving voltage and relatively improved lifespan as compared to the organic light emitting display device not using the compound. In other words, according to the present invention, a host material including a carbazole compound having hole characteristics in combination with a material having electron characteristics is used among the materials having hole characteristics and electron characteristics, so that the lifespan and efficiency of an organic light emitting layer is optimized simultaneously.

Therefore, a hetero compound having a carbazole compound and a material having electron characteristics including a heteroaryl group is used for an organic layer of organic light emitting display device according to the present invention, and thus it is possible to improve electrical stability and to ensure thermal stability while providing high triplet energy by the hetero compound having bipolar property.

In addition, according to the present invention, a hetero compound having a carbazole compound and a material having electron characteristics including a heteroaryl group is used for at least one of an electron blocking layer, an electron transport layer, a hole transport layer, host of an emitting layer and a hole blocking layer in an organic light emitting display device, and thus it is possible to improve the lifespan of a device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

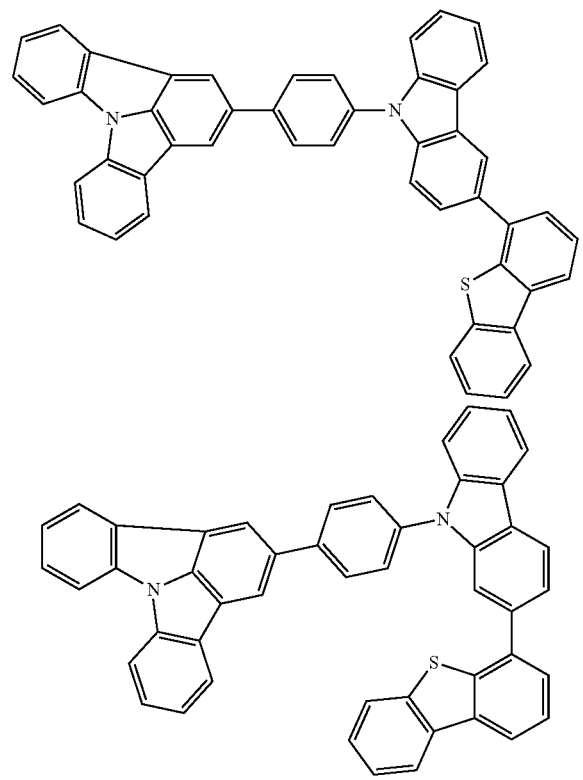

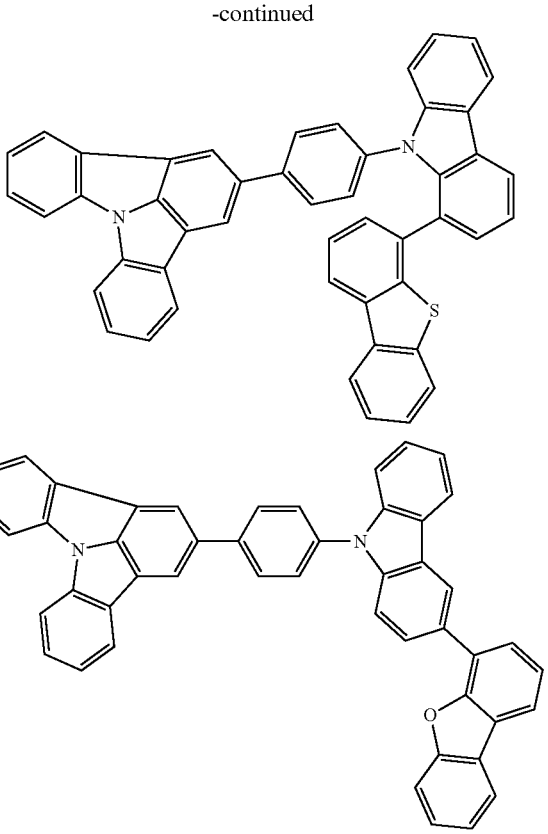

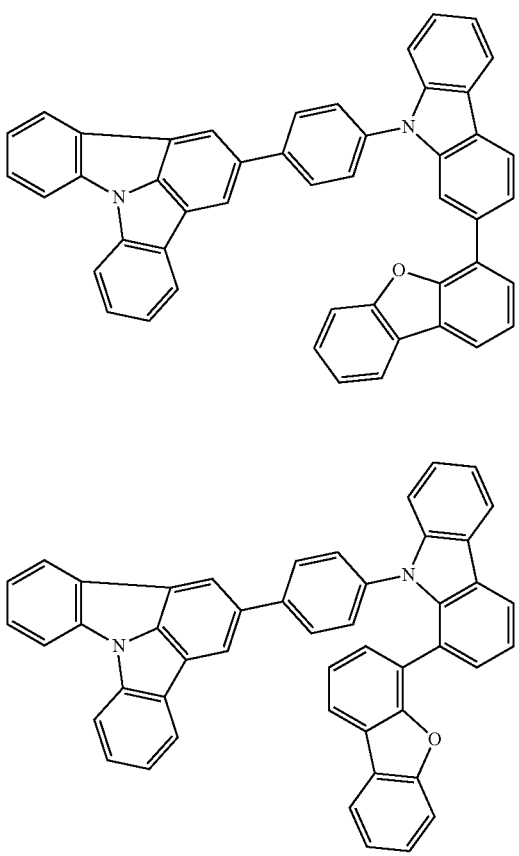

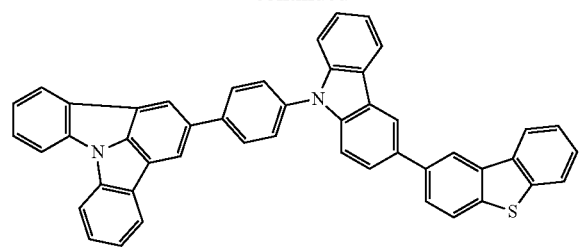
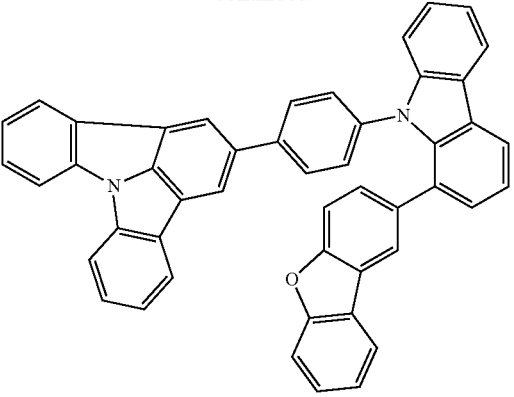

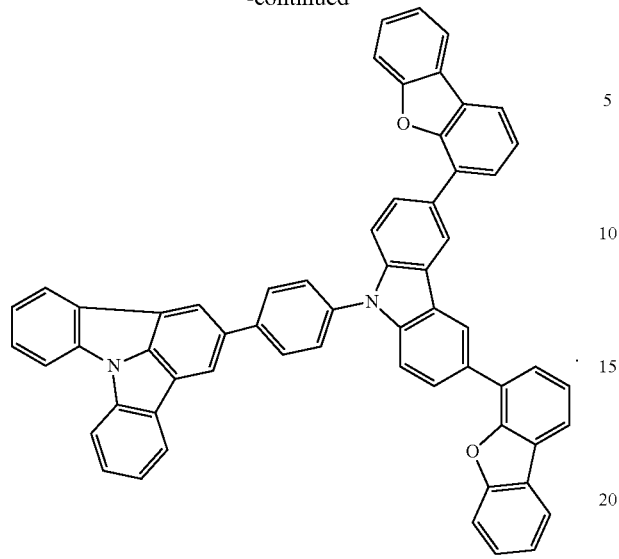

What is claimed is:

1. An organic light emitting display device, comprising:

an anode;

a hole transport layer on the anode;

an emitting layer on the hole transport layer;

an electron transport layer on the emitting layer; and a cathode on the electron transport layer, wherein the emitting layer comprises a compound that is one among:

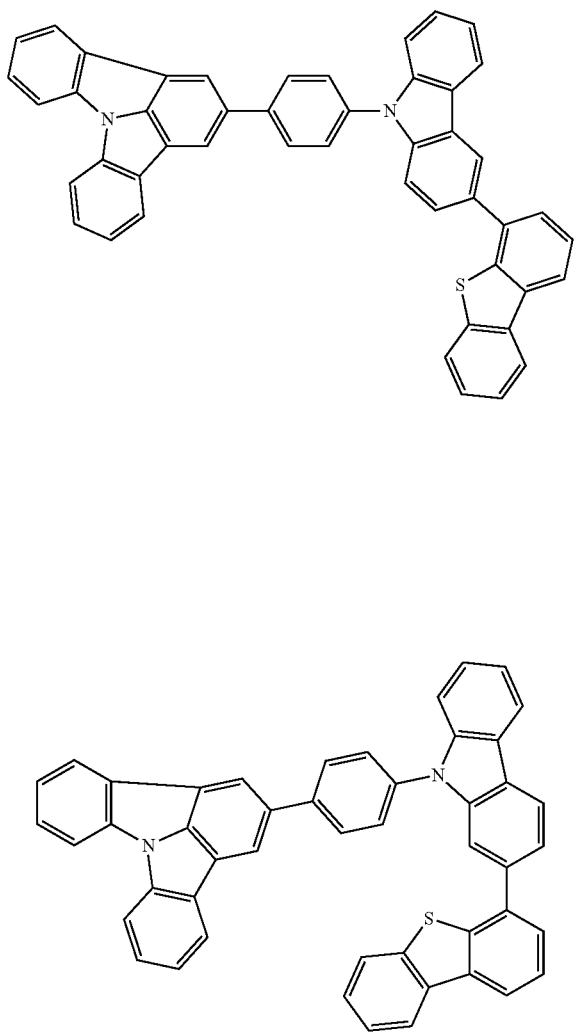

-continued

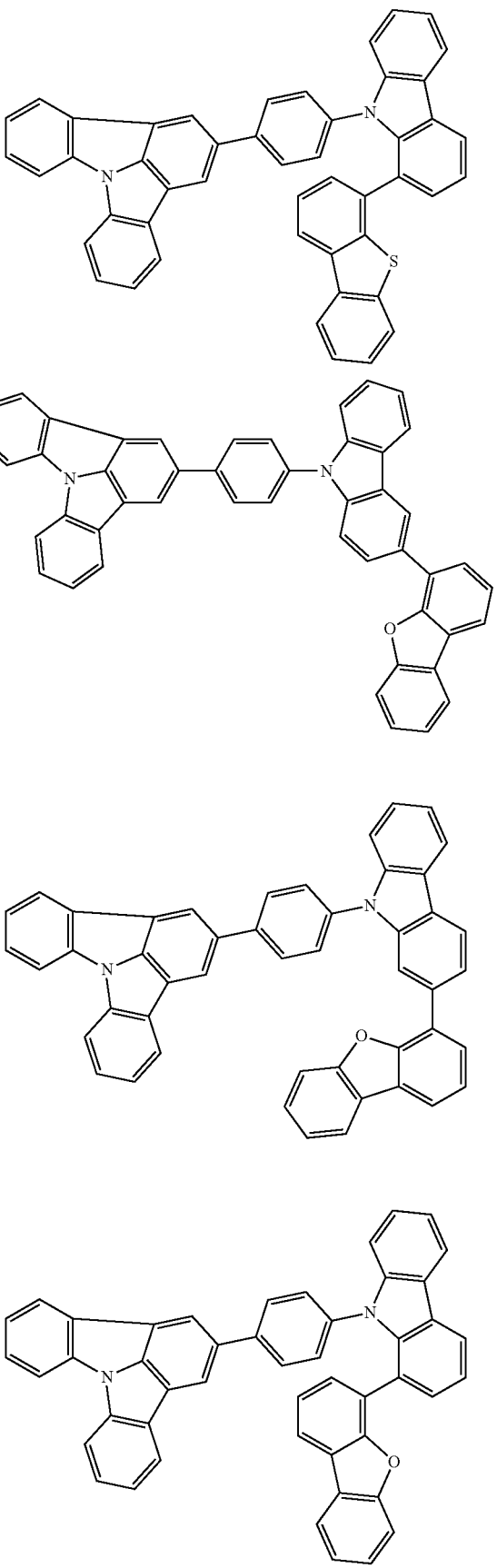

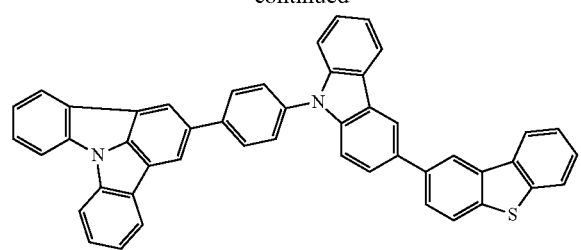
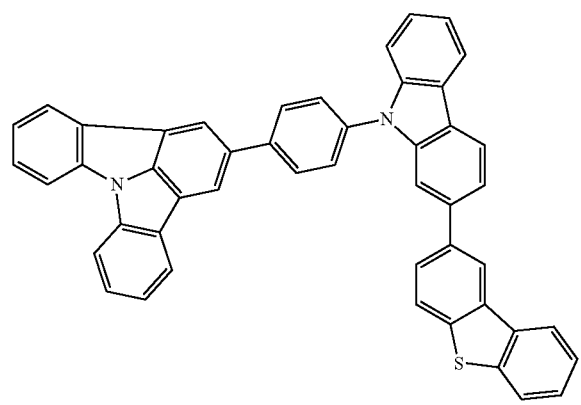
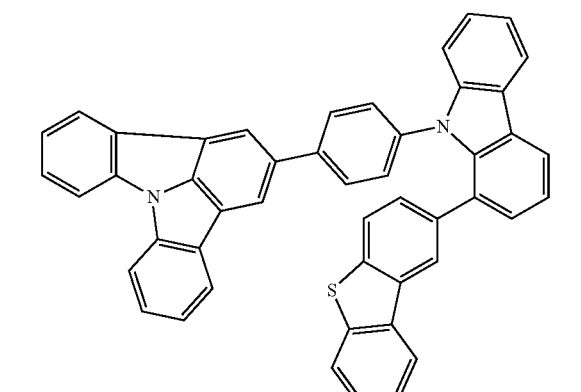
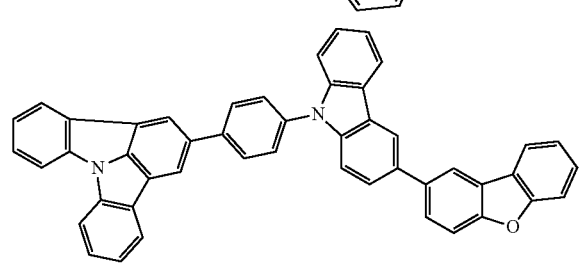
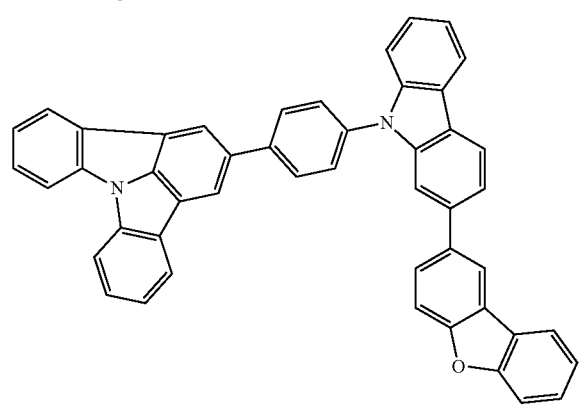
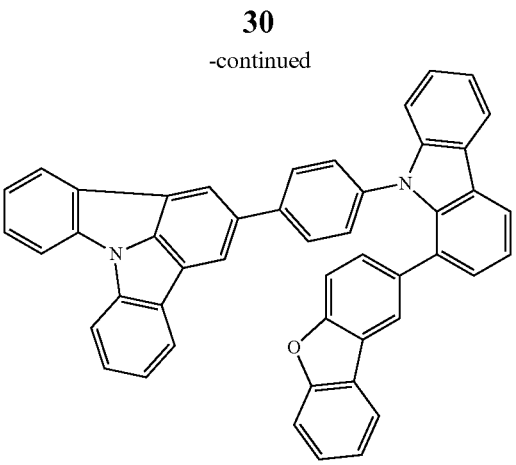
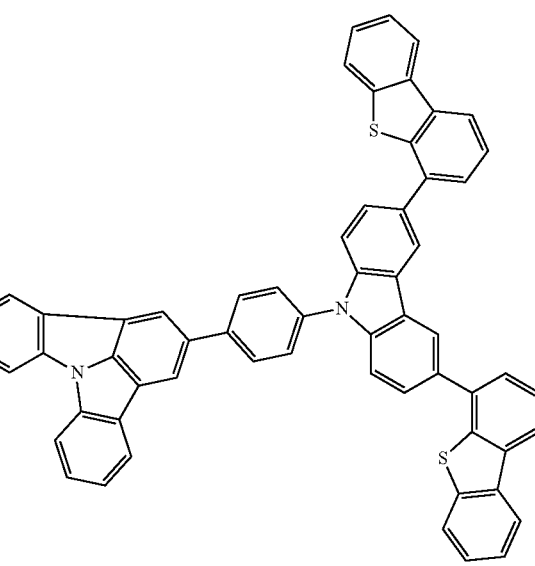
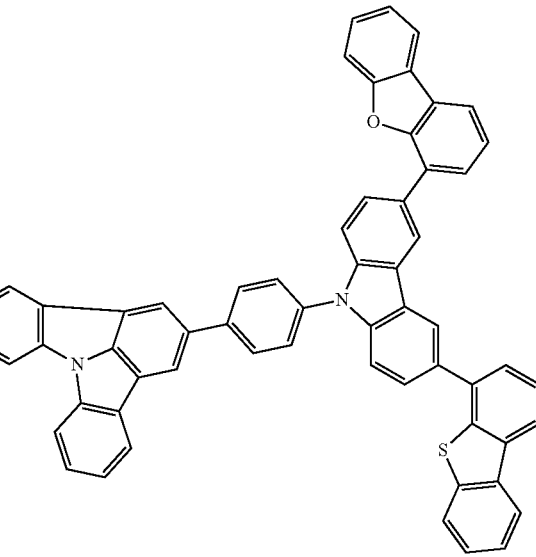

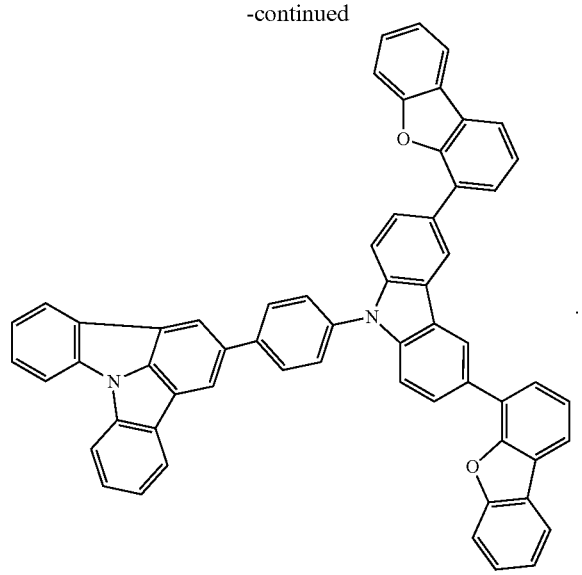

2. The organic light emitting display device of claim 1, further comprising:
   a hole injection layer on the anode;
   an electron blocking layer on the hole injection layer;
   a hole blocking layer on the electron blocking layer; and
   an electron injection layer on the hole blocking layer,
wherein at least one of the hole transport layer and the electron transport layer includes the compound.

3. An emitting layer of an organic light emitting display device, the emitting layer comprising a host material which includes a compound having a carbazole group, where the compound is one among: